United States Patent [19]
Hurst et al.

[11] Patent Number: 6,048,739
[45] Date of Patent: Apr. 11, 2000

[54] METHOD OF MANUFACTURING A HIGH DENSITY MAGNETIC MEMORY DEVICE

[75] Inventors: Allan T. Hurst, Anoka; Jeffrey S. Sather, Medina; William F. Witcraft, Minneapolis; Cheisan J. Yue, Roseville, all of Minn.

[73] Assignee: Honeywell Inc., Morristown, N.J.

[21] Appl. No.: 08/993,005

[22] Filed: Dec. 18, 1997

[51] Int. Cl.[7] .................................................. H01L 21/00
[52] U.S. Cl. ........................... 438/3; 438/171; 438/210; 438/131
[58] Field of Search ................................ 438/3; 365/171, 365/173, 210, 131, 266, 688

[56] References Cited

U.S. PATENT DOCUMENTS

| | | | |
|---|---|---|---|
| 3,816,909 | 6/1974 | Maeda et al. | 29/604 |
| 3,947,831 | 3/1976 | Kobayashi et al. | 340/174 |
| 4,044,330 | 8/1977 | Johnson et al. | 340/166 |
| 4,060,794 | 11/1977 | Feldman et al. | 364/900 |
| 4,158,891 | 6/1979 | Fisher | 365/222 |
| 4,455,626 | 6/1984 | Lutes | 365/158 |
| 4,731,757 | 3/1988 | Daughton et al. | 365/173 |
| 4,780,848 | 10/1988 | Daughton et al. | 365/173 |
| 5,039,655 | 8/1991 | Pisharody | 505/1 |
| 5,064,499 | 11/1991 | Fryer | 156/643 |
| 5,140,549 | 8/1992 | Fryer | 365/171 |
| 5,496,759 | 3/1996 | Yue et al. | 437/52 |
| 5,547,599 | 8/1996 | Wolfrey et al. | 252/62.54 |
| 5,569,617 | 10/1996 | Yeh et al. | 437/48 |
| 5,861,328 | 1/1999 | Tehrani et al. | 438/210 |

OTHER PUBLICATIONS

Pohm et al., "The Architecture of a High Performance Mass Store with GMR Memory Cells", *IEEE Trans on Mag.*, vol. 31, No. 6., Nov. 1995.

Pohm et al., "Experimental and Analytical Properties of 0.2 Micron Wide, Multi–Layer, GMR, Memory Elements", *IEEE Trans. on Mag.*, vol. 32, No. 5, Sep. 1996.

*Primary Examiner*—Tuan H. Nguyen
*Attorney, Agent, or Firm*—Kris T. Fredrick

[57] ABSTRACT

A high density magnetic memory device and method of manufacture therefor, wherein the magnetic bit region is provided after selected higher temperature processing steps are performed. Illustrative higher temperature processing steps include those that are performed above for example 400° C., any may include contact and via plug processing. The present invention may allow, for example, contact and via plug processing to be used to form magnetic RAM devices. As indicated above, contact and/or via plug processing typically allows the size of the contacts and vias to be reduced, and the packing density of the resulting memory device to be increased.

26 Claims, 8 Drawing Sheets

METHOD OF MANUFACTURING A HIGH DENSITY MAGNETIC MEMORY DEVICE

CROSS REFERENCE TO CO-PENDING APPLICATIONS

The present application is related to U.S. patent application Ser. No. 08/993,009, filed Dec. 18, 1997, entitled "SELF-ALIGNED WORDLINE KEEPER AND METHOD OF MANUFACTURE THEREFOR", which is assigned to the assignee of the present invention and incorporated herein by reference.

This invention was made with Government support under Contract Number N00014-96-C-2114 awarded by DARPA and NRL. The Government has certain rights in the invention.

BACKGROUND OF THE INVENTION

1. Field of the Invention

The present invention generally relates to ferromagnetic thin film memories and sensors and, more particularly, relates to high density magnetic memory devices and sensors and methods of manufacturing therefor.

2. Description of the Prior Art

Digital memories of various kinds are used extensively in computer and computer system components, digital processing systems and the like. Such memories can be formed, to considerable advantage, based on the storage of digital bits as alternative states of magnetization of magnetic materials in each memory cell, typically thin-film materials. These films may be thin ferromagnetic films having information stored therein based on the direction of the magnetization occurring in those films. The information is typically obtained either by inductive sensing to determine the magnetization state, or by magnetoresistive sensing of each state.

Such ferromagnetic thin-film memories may be conveniently provided on the surface of a monolithic integrated circuit to thereby provide easy electrical interconnection between the memory cells and the memory operating circuitry on the monolithic integrated circuit. When so provided, it is desirable to reduce the size and increase the packing density of the ferromagnetic thin-film memory cells to achieve a significant density of stored digital bits.

Typically, a thin-film magnetic memory includes a number of bit lines intersected by a number of word lines. At each intersection, a thin film of magnetically coercive material is interposed between the corresponding word line and bit line. The magnetic material at each intersection forms a magnetic memory cell in which a bit of information is stored.

The word lines are often provided on a first metal interconnect layer and the bit lines are provided on another. In each case, the metal interconnect layers must typically be connected to supporting circuitry or other underlayer structures on the monolithic integrated circuit for the memory to function. In addition, portions of the first metal interconnect layer are often connected to portions of the second metal interconnect layer to complete selected circuit elements.

When connecting a first interconnect layer with certain underlayers like poly runners or field areas, a contact structure is typically used. A contact structure includes an opening through a dielectric layer separating the underlayers and the first interconnect layer, which is then filled by the first interconnect layer or more preferably a plug. A plug is typically made from tungsten or similar material having high conductivity, and often enables the contact structure to be reduced in size while maintaining an acceptable contact resistance.

When connecting a second interconnect layer with another interconnect layer, such as the first interconnect layer, a via structure is typically used. A via structure typically includes an opening through the dielectric layer separating the corresponding interconnect layers, which is then filled by one of the interconnect layers, or more preferably a plug. As described above, a plug is typically made from tungsten or similar material having high conductivity, and enables the via structure to be reduced in size while maintaining an acceptable via resistance.

In a typical semiconductor fabrication process, plug processing, and in particular tungsten plug processing, is performed at a relatively high temperature such as greater than 450° C. These high temperatures can often damage or otherwise reduce the effectiveness of the magnetic materials in the bit region of a memory cell. Since the bit region is typically formed before the contacts or vias, the bit region would be subjected to the relatively high temperatures associated with contact and via processing when provided.

Accordingly, conventional magnetic RAM processes forego the use of contact and via plugs. Thus, to achieve an acceptable contact and via resistance, the size of the contact and via structures must typically be increased. Likewise, the size of the metal interconnect layers must be increased to meet the minimum overlap rules associated with most integrated circuit processes. This in-turn reduces the packing density that can be achieved for the memory device.

SUMMARY OF THE INVENTION

The present invention overcomes many of the disadvantages of the prior art by providing a high density magnetic memory device and method of manufacture therefor, wherein the magnetic bit region is provided after selected higher temperature processing steps are performed. Illustrative higher temperature processing steps include those that are performed above for example 400° C., any may include contact and via plug processing. The present invention may allow, for example, contact and via plug processing to be used to form magnetic RAM devices. As indicated above, contact and/or via plug processing typically allows the size of the contacts and vias to be reduced, and the packing density of the resulting memory device to be increased.

In one embodiment of the present invention, a first insulating layer is provided over the underlayers of an integrated circuit. Openings are then formed through the first insulating layer to align with a desired underlayer location such as a poly runner or a field region. A first metal interconnect layer is then provided to at least partially overlay selected openings. It is contemplated that a plug may be provided to at least partially fill the openings before the first metal interconnect layer is provided. This may reduce the resulting contact resistance.

Thereafter, a second insulating layer is provided on top of the first metal interconnect layer. It is recognized that portions of the first metal interconnect layer may be removed so that the second insulating layer directly engages the first insulating layer. Preferably, the second insulating layer is planarized using a polishing process, and in particular, a chemical-mechanical polishing process.

Via openings are then provided through the second insulating layer using a well known via etch technique. A second metal interconnect layer is then provided to at least partially overlay selected via openings. It is contemplated that a via plug may be provided to at least partially fill the via openings before the second metal interconnect layer is provided. This may reduce the resulting via resistance. The vias are preferably positioned to interconnect selected portions of the first metal interconnect layer to the second metal interconnect layer.

A third insulating layer is then provided on top of the second metal interconnect layer. The third insulating layer may be planarized using a polishing process, and in particular, a chemical-mechanical polishing process. Yet another set of via openings are provided through the third insulating layer using a well known via etch technique. Again, it is contemplated that a via plug may be provided to at least partially fill the via openings.

Next, a barrier layer is preferably provided on the third insulating layer to receive the magnetic materials of the bit region. The barrier layer and the third insulating layer can be thought of as a single insulating layer. The barrier layer helps prevent diffusion between the magnetic materials and the third insulating layer. Preferably, the barrier layer is planarized using a polishing process, and in particular, a chemical-mechanical polishing process. At this point, all contact and via processing is completed.

The magnetic materials are then deposited on the barrier layer to form the bit region. A portion of the magnetic materials and the barrier layer are etched away except at the desired bit location. A low temperature bit oxide is then deposited on top of the magnetic materials, and etched to overlap only selected portions of the bit region. Finally, A third metal interconnect layer is provided to selectively overlay the vias previously formed in the third insulating layer.

As can readily be seen, the magnetic materials are provided after all contact and vias processing is performed. This may reduce the exposure of the magnetic materials to the higher temperatures typically associated with contact and via processing, and in particular, contact and via plug processing. Thus, the present invention may allow contact and via plug processing to be used in magnetic RAM devices, thereby increasing the packing density of the same.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

As indicated above, the present invention provides a high density magnetic memory device and method of manufacture therefor, wherein the magnetic bit region is provided after selected higher temperature processing steps are performed. Illustrative higher temperature processing steps include those that are performed above for example 400° C., any may include contact and via plug processing. The present invention may allow, for example, contact and via plug processing to be used to form magnetic RAM devices. As indicated above, contact and/or via plug processing typically allows the size of the contacts and vias to be reduced, and the packing density of the resulting memory device to be increased.

Figure 1A:
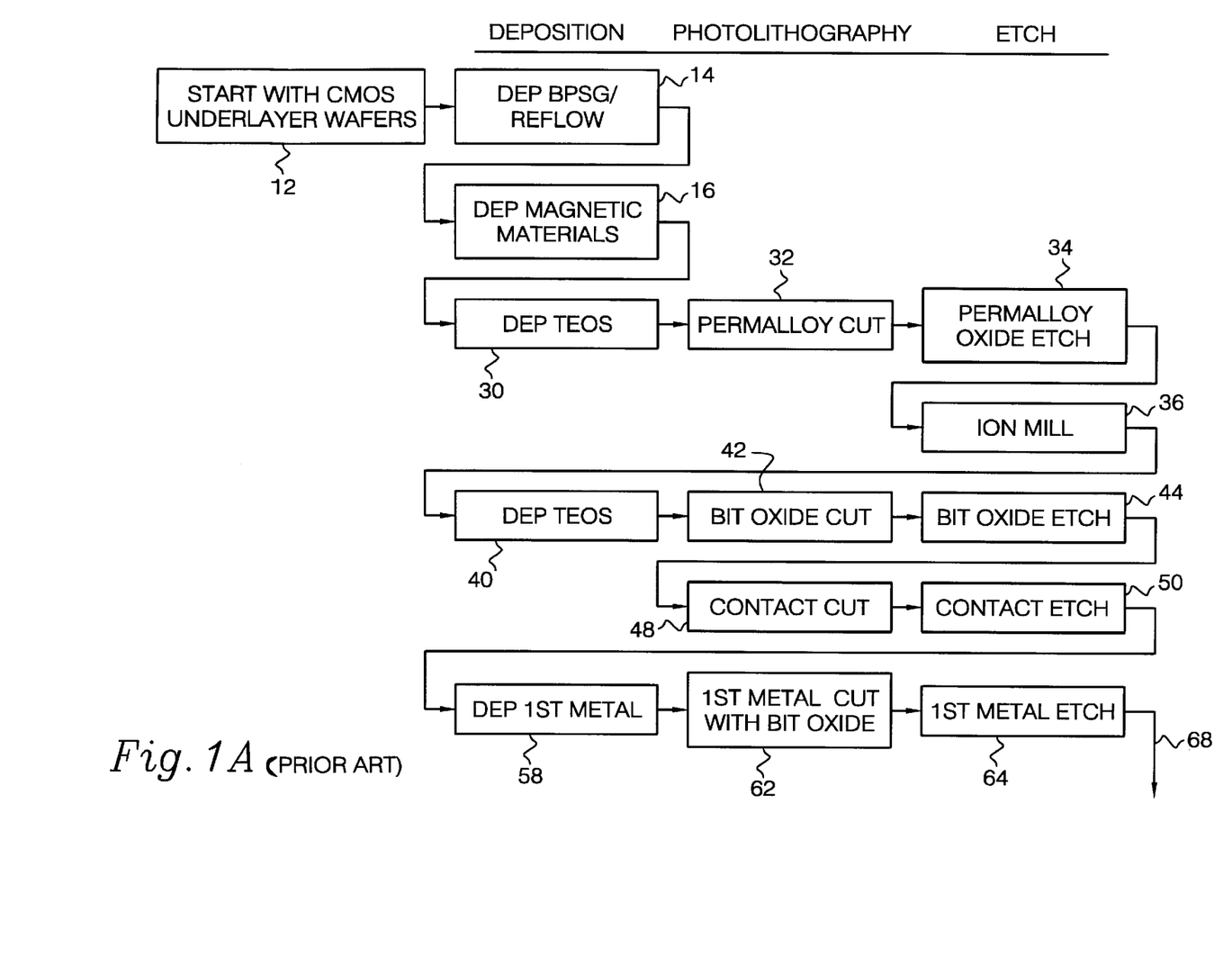
FIGS. 1A and 1B show a flow diagram of a prior art process flow for forming a magnetoresistive memory device.
Figure 1B:
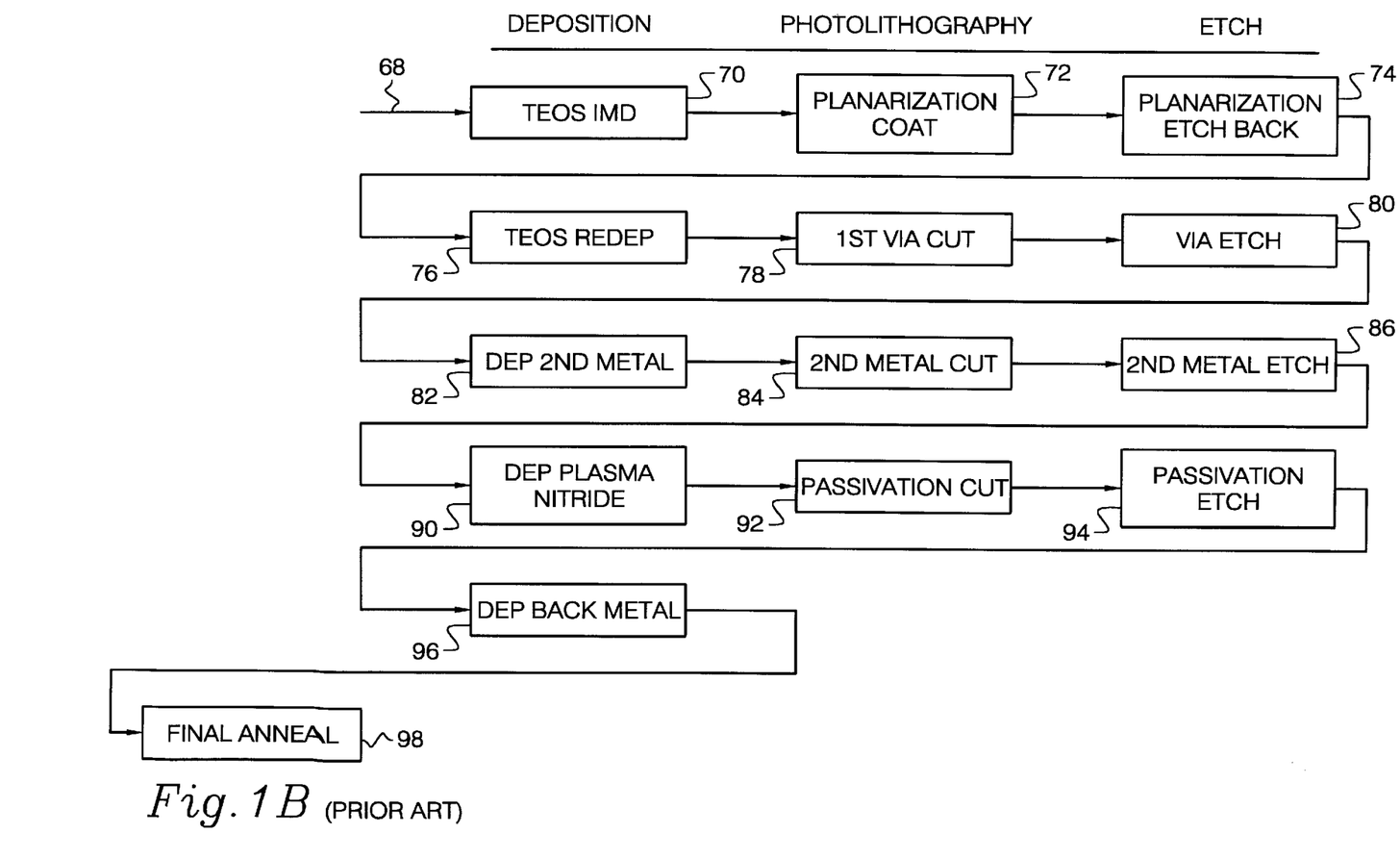
Figure 2:
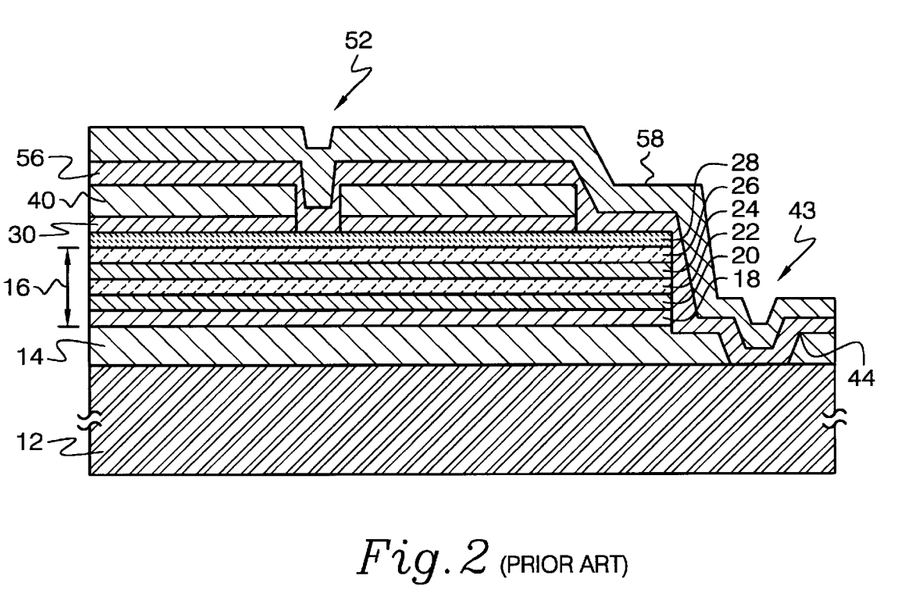
FIG. 2 is a partial cross-sectional side view of a prior art magnetoresistive memory cell formed using the process flow of FIGS. 1A and 1B.

FIGS. 1A and 1B show a flow diagram of a prior art process flow for forming a magnetoresistive memory device. FIG. 2 is a partial cross-sectional side view of a prior art magnetoresistive memory cell formed using the process flow of FIGS. 1A and 1B. To provide a correspondence between the process steps of FIGS. 1A–1B and the corresponding layers shown in FIG. 2, like reference numerals are used where applicable.

The prior art process begins at 12 with wafers processed up through contact oxide deposition. U.S. Pat. No. 4,731,757 dated Mar. 15, 1988 and U.S. Pat. No. 4,780,848 dated Oct. 25, 1988 and assigned to Honeywell, Inc., include background material on magnetoresistive memories and are hereby incorporated by reference. Such a wafer 12 is shown in FIG. 2.

Depending on the thickness of the standard oxide, additional oxide may be added to wafer 12. Normal front-end IC processing typically deposits approximately 5000 angstroms of borophosphosilicate glass (BPSG) over the poly runners and field areas. The topography in a normal IC process can be more severe than is desired for MRAM devices. To provide the additional oxide thickness needed to smooth out the remaining underlayer topography, process step 14 adds an additional approximately 3000 angstroms of BPSG, and reflows it at approximately 800 decrees C to result in an approximately 8000 angstrom layer. This layer is shown at 14 in FIG. 2.

Following reflow, the magnetic materials are deposited, as shown at step 16. However, before depositing the magnetic materials, it is contemplated that a diffusion barrier layer 18 may be provided, e.g., of silicone nitride, which is sputter deposited to a thickness of approximately 300 angstroms to act as a diffusion barrier between the underlying oxide layer 14 and a future magnetic materials deposition.

Next in the process is the deposition of the magnetic layers or magnetic stack 16. Magnetic stack 16 may be a sandwich-type structure containing a first layer 20 of a 65% Ni, 15% Fe, 20% Co Permalloy of approximately 150 angstroms. Next, a non-magnetic intermediate layer 22 of TaN is deposited to a thickness of approximately 50 angstroms. Then, a second layer 24 of a Permalloy is deposited to a thickness of approximately 150 angstroms. This is followed by depositing a second non-magnetic resistive layer 26 of tantalum nitride to a thickness of 100–1000 angstroms, preferably about 550 angstroms. A capping, or etch stop, layer 28 of Chromium silicon (CrSi) is then deposited to a thickness in the range of 100 to 1500 angstroms, preferably about 800 angstroms.

All of the depositions of magnetic stack 16 are done in-situ, for example in a Comptech ISL-3000 sputter deposition system. The deposition of Permalloy layers 20 and 24 are done in the presence of a 25 Oersted magnetic field. The wafer is then subjected to a 350 degree C, 1 hour, 1000 Oersted anneal to set the easy axis of Permalloy layers 20 and 24.

Still referring to FIGS. 1A–1B and 2, a first layer 30 of an amorphous dielectric, e.g., Plasma Enhanced Chemical Vapor Deposition Tetra-ethyl-ortho-silicate (PECVD TEOS), is deposited to a thickness of approximately 3200 angstroms. TEOS layer 30 is then patterned and etched to serve as a masking layer, as shown by process steps 32 and 34, respectively. This masking layer defines the MRAM bit pattern for ion milling. The wafers are then ion milled as shown at process step 36, for example in a Commonwealth ion mill. The ion milling removes the exposed portions of magnetic stack 16 to form a bit pattern. The ion milling step 34 removes approximately 2600 angstroms of TEOS layer 30, resulting in TEOS layer 30 having a thickness of approximately 600 angstroms.

Next, a second layer 40 of amorphous dielectric, e.g., PECVD TEOS, is deposited to a thickness of approximately 2500 angstroms. TEOS layer 40 is deposited to protect the sidewalls of the bit region from the bit oxide and first metal etch, which are used for opening the bit-end contact between magnetic stack 16, bit-end and first metal.

As shown at step 42, a bit oxide photo cut is made at silicon interconnection location 43 and shorting bar location 52. A dry etch process step 44 is used to remove TEOS layer 40 and TEOS layer 30 for a silicon interconnection at the bit end 43 and at shorting bar location 52. A portion of TEOS layer 40 and TEOS layer 30 are removed to facilitate better first metal step coverage.

Next a contact photo cut 48 is made at silicon interconnection location 42. A dry etch 50 is used to remove portions of BPSG layer 14 to form via 44. Next, a layer of aluminum copper AlCu is deposited to a thickness of about 5000 angstroms. The deposition of first metal comprised of layer 56 and layer 58 is by known methods.

First metal is then patterned and etched as shown by process steps 62 and 64, respectively. After first metal etch step 64, a 200 to 1000 angstrom, preferably a 500 angstrom thick layer of sputtered nitride is deposited to serve as an adhesion layer of first metal and inter-metal dielectric (IMD). This layer and all subsequent layers are not shown in FIG. 2, as they are well known in the art.

Following the sputtered nitride layer, an 8000 angstrom thick layer of PECVD TEOS is deposited as the inter-metal dielectric (IMD) layer. In the process flow shown, the TEOS IMD step 70 provides both the TEOS layer and the sputtered nitride layer. Steps 72 and 74 planarize the top surface of the sputtered nitride layer using a planarization coat and planarization etch back process, respectively.

Step 76 re-deposits an IMD and nitride layer using the TEOS process. Steps 78 and 80 cut and etch the vias. Steps 82, 84 and 86 deposit, pattern and etch the second metal interconnect layer.

Steps 90, 92 and 94 provide a 9000 angstrom thick layer of plasma nitride as a final passivation layer. Following passivation, a back metal is deposited at step 96. Finally, the wafers are annealed at 250 to 500 degrees C, preferably 325° C. for one hour in a magnetic field to permanently set the easy axis orientation transverse to the bits at step 98. A 4000 Oersted magnetic field has been used successfully. Other magnetic field values may also be used.

In the process described above, the amorphous dielectric layers 30 and 40 were described as bias sputter quartz. Other amorphous dielectric materials may be used for example sputter silicon nitride.

As can be seen, the prior art process deposits the magnetic materials before the contact and via structures are formed. To avoid damaging the magnetic materials, tungsten plugs are typically avoided in the prior art when fabricating MRAM devices. If tungsten plugs are desired, the magnetic materials will likely be damaged to at least some degree, reducing the effectiveness of the memory.

Figure 3A:
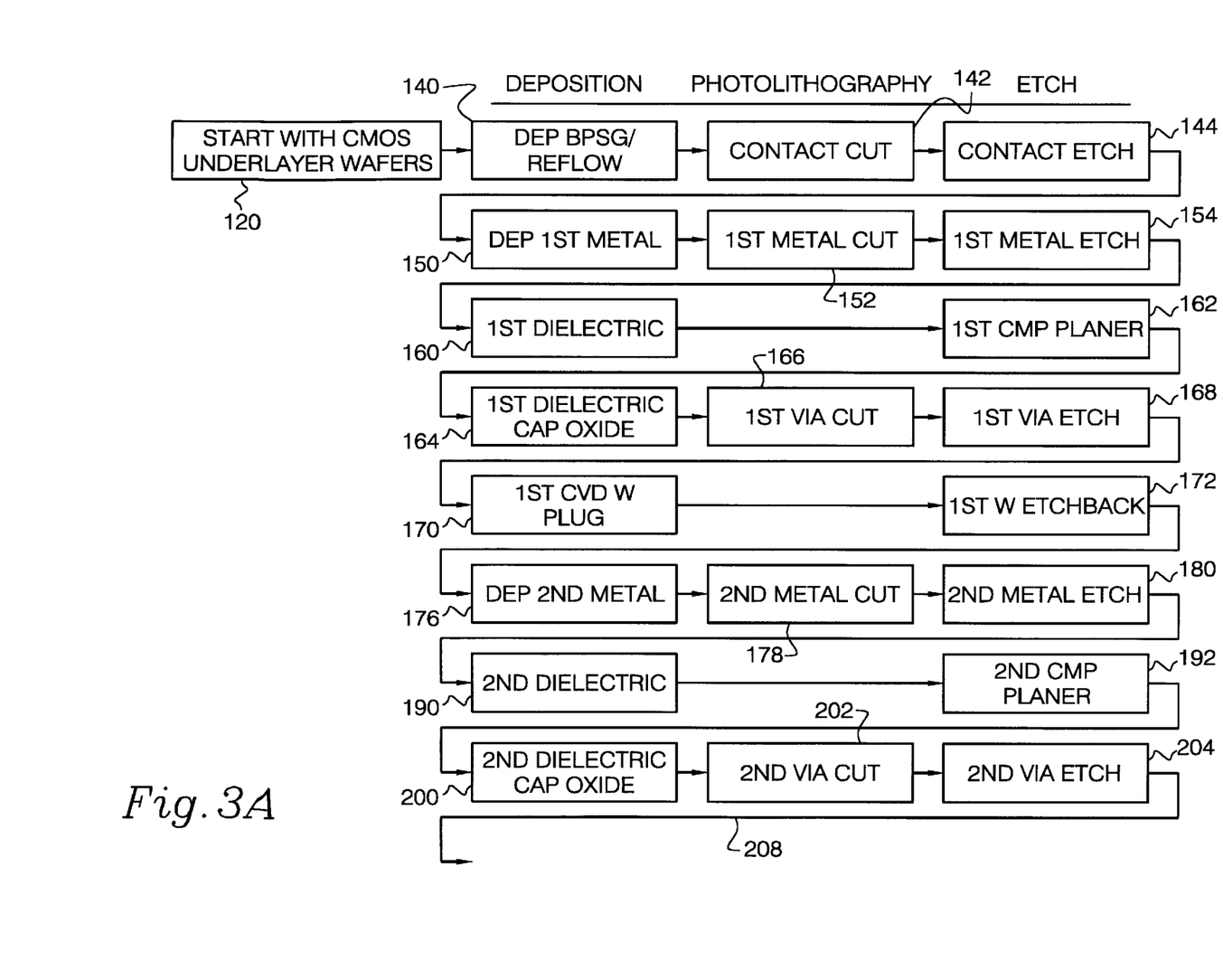
FIGS. 3A and 3B show a flow diagram of a process flow for forming a magnetoresistive memory device in accordance with in illustrative embodiment of the present invention.
Figure 3B:
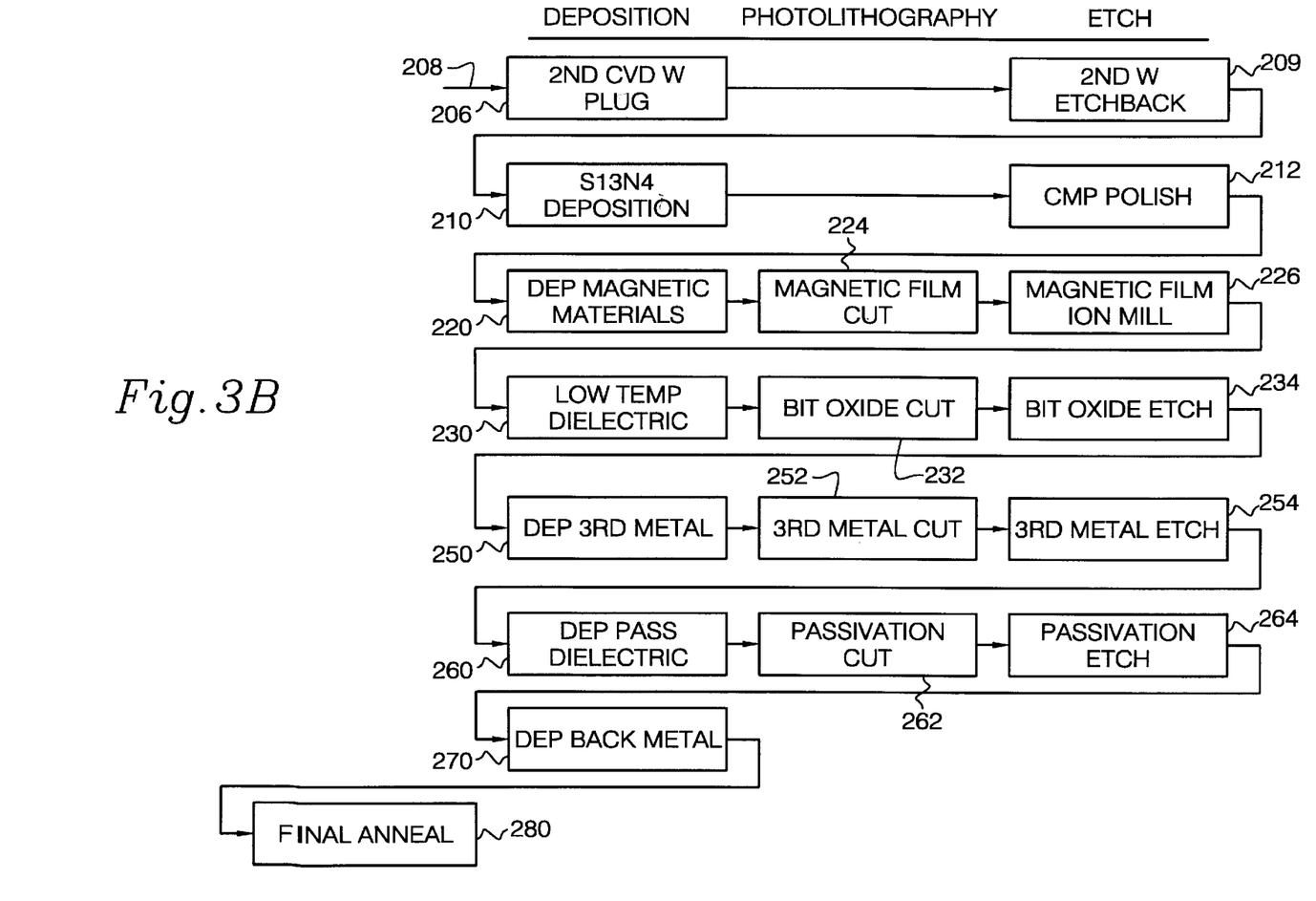

FIGS. 3A and 3B show a flow diagram of a process flow for forming a magnetoresistive memory device in accordance with in illustrative embodiment of the present invention. FIGS. 4A–4F show partial cross-sectional side views of an illustrative magnetoresistive memory cell at different stages in the process flow of FIGS. 3A and 3B. To provide a correspondence between the process steps of FIGS. 3A–3B and the corresponding layers of FIGS. 4A–4F, like reference numerals are used, where applicable.

The process of the present invention begins at 120 with wafers processed up through contact oxide deposition. U.S. Pat. No. 4,731,757 dated Mar. 15, 1988 and U.S. Pat. No. 4,780,848 dated Oct. 25, 1988 and assigned to Honeywell, Inc., include background material on magnetoresistive memories and are hereby incorporated by reference. Such a wafer 120 is shown in FIGS. 4A.

Depending on the thickness of the standard oxide, additional oxide may be added to wafer 120. Normal front-end IC processing typically deposits approximately 5000 angstroms of borophosphosilicate glass (BPSG) over the poly runners and field areas. The topography in a normal IC process can be more severe than is desired for MRAM devices. To provide the additional oxide thickness needed to smooth out the remaining underlayer topography, process step 140 adds an additional approximately 3000 angstroms of BPSG, and reflows it at approximately 800 decrees C to result in the approximately 8000 angstrom layer 140 of FIG. 4A.

Figure 4A:
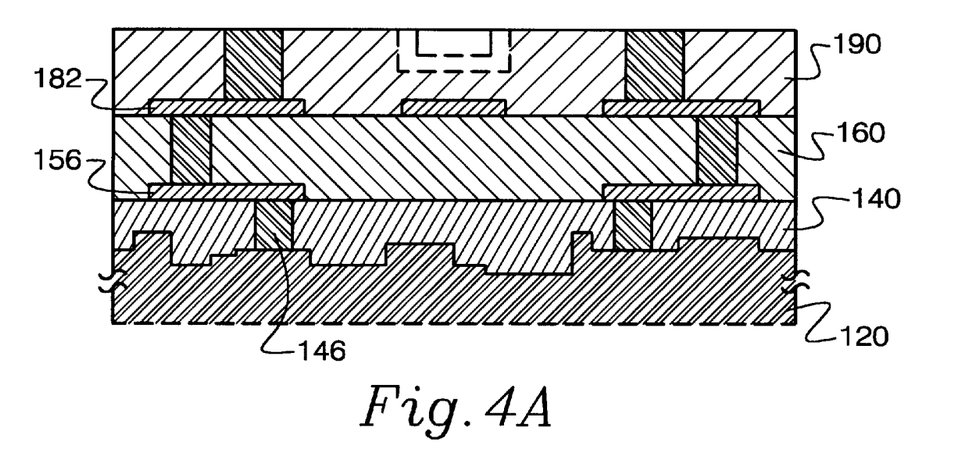
FIGS. 4A–4F show partial cross-sectional side views of an illustrative magnetoresistive memory cell at different stages in the process flow of FIGS. 3A and 3B.
Figure 4B:
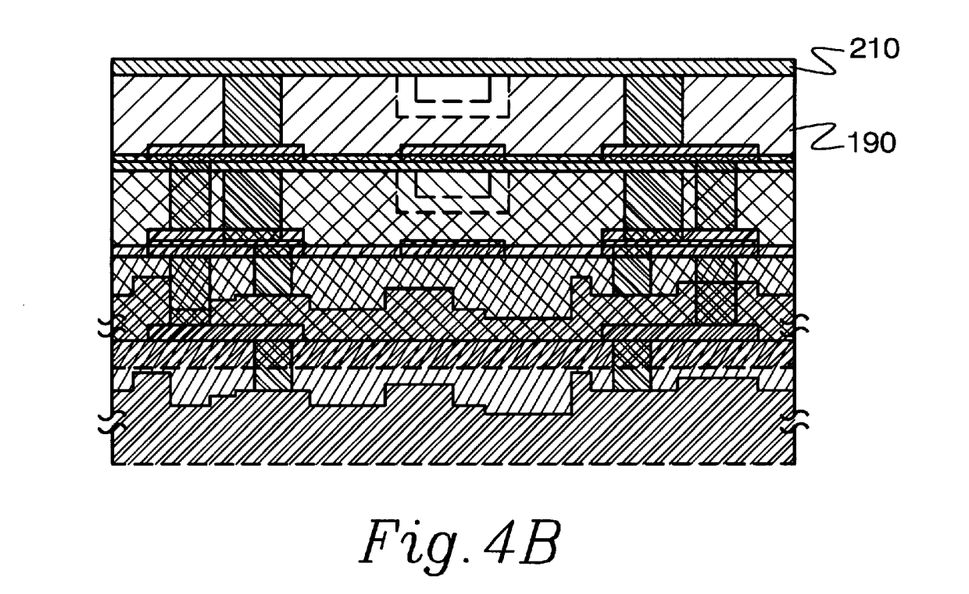

Following reflow, steps 142 and 144 form a number of contact openings, for example contact opening 146 in FIG. 4A, in dielectric layer 140. The contact opening are preferably positioned to interconnect a portion of a first interconnect layer with a desired underlayer such as a poly runner or field region. In a preferred embodiment, contact plugs are not used to fill the contact openings. However, it is contemplated that contact plugs may be used if desired.

Process steps 150, 152 and 154 deposit, pattern and etch a first metal interconnect layer, respectively. The first metal interconnect layer is shown at 156 in FIG. 4A. Thereafter, a second dielectric layer 160 is deposited on the first metal interconnect layer.

In a preferred embodiment, the second dielectric layer 160 is planarized using a polishing process at step 162. Both mechanical and chemical-mechanical polishing are contemplated, with the later being preferred. In performing the polishing step 162, a commercial semiconductor CMP polishing system is used, which is available from Strasbaugh, IPEC, Speedpham and other suppliers. Preferably, a Strasbaugh 6DT system is used in conjunction with a Suba IV polishing pad available from Rodel Corporation. A SS25 colloidal silica slurry is preferably used, available from Cabot. The platten speed is preferably set to 30–60 revolutions per minute, and the down pressure is set to 2–5 PSI.

Once planarized, an cap oxide, or etch stop, is deposited on the second dielectric layer at step 164. Steps 166 and 168 provide a number of via openings in the second dielectric layer 160. Then via plugs are provided in the number of openings to reduce the resistance of the via structures as shown at steps 170 and 172. Via plug processing is typically performed at or above about 400° C., and can be provided in accordance with the present invention because the magnetic materials have not yet been deposited. The via plugs are preferably formed from tungsten, and are provided by a well-known chemical-vapor-deposition (CVD) process.

Next, process steps 176, 178 and 180 deposit, pattern and etch a second metal interconnect layer, respectively. The second metal interconnect layer is shown at 182 in FIG. 4A. Thereafter, a third dielectric layer 190 is deposited on the second metal interconnect layer.

In a preferred embodiment, the third dielectric layer 190 is also planarized using a polishing process at step 192. Both mechanical and chemical-mechanical polishing are contemplated, with the later being preferred. In performing the polishing step 192, a commercial semiconductor CMP polishing system is used, which is available from Strasbaugh, IPEC, Speedpham and other suppliers. Preferably, a Strasbaugh 6DT system is used in conjunction with a Suba IV polishing pad available from Rodel Corporation. A SS25 colloidal silica slurry is preferably used, available from Cabot. The platten speed is preferably set to 30–60 revolutions per minute, and the down pressure is set to 2–5 PSI.

Once planarized, a cap oxide, or etch stop, is deposited on the third dielectric layer, as shown at step 200. Steps 202 and 204 provide a number of via openings in the third dielectric layer 190. Referring now specifically to FIG. 3B, number of via plugs are then provided, as shown at steps 206 and 209. The via plugs are preferably formed from tungsten, and are provided by a chemical-vapor-deposition (CVD) process.

Step 210 deposits a silicon nitride barrier layer on the third dielectric layer 190. This is explicitly shown in FIG. 4B by the addition of layer 210. A chemical-mechanical polishing step 212 is then used to planarize the silicon nitride layer. The chemical-mechanical polishing step 212 is performed as described above. Silicon nitride is non-conductive, and thus the third dielectric layer and the silicon nitride layer may collectively be referred to as a single dielectric layer.

The polishing step 212 provides a smooth seed surface for growing the magnetic materials, and thus allows the magnetic materials to be of reduced in size. In performing the polishing step 212, a commercial semiconductor CMP polishing system is used, which is available from Strasbaugh, IPEC, Speedpham and other suppliers. Preferably, a Strasbaugh 6DT system is used in conjunction with a Suba IV polishing pad available from Rodel Corporation. A SS25 colloidal silica slurry is preferably used, available from Cabot. The platten speed is preferably set to 30–60 revolutions per minute, and the down pressure is set to 2–5 PSI.

Next, process step 220 deposits the magnetic materials or magnetic stack. Like the prior art, magnetic stack 220 may be a sandwich-type structure containing a first layer 20 of a 65% Ni, 15% Fe, 20% Co Permalloy of approximately 150 angstroms. Next, a non-magnetic intermediate layer of TaN is deposited to a thickness of approximately 50 angstroms. Then, a second layer of a Permalloy is deposited to a thickness of approximately 150 angstroms. This is followed by depositing a second non-magnetic resistive layer of tantalum nitride to a thickness of 50–1000 angstroms, preferably about 550 angstroms. A capping, or etch stop, layer of Chromium silicon (CrSi) is then deposited to a thickness in the range of 100 to 1500 angstroms, preferably about 800 angstroms. The deposition of the magnetic stack 220 is explicitly shown in FIG. 4C.

Figure 4C:
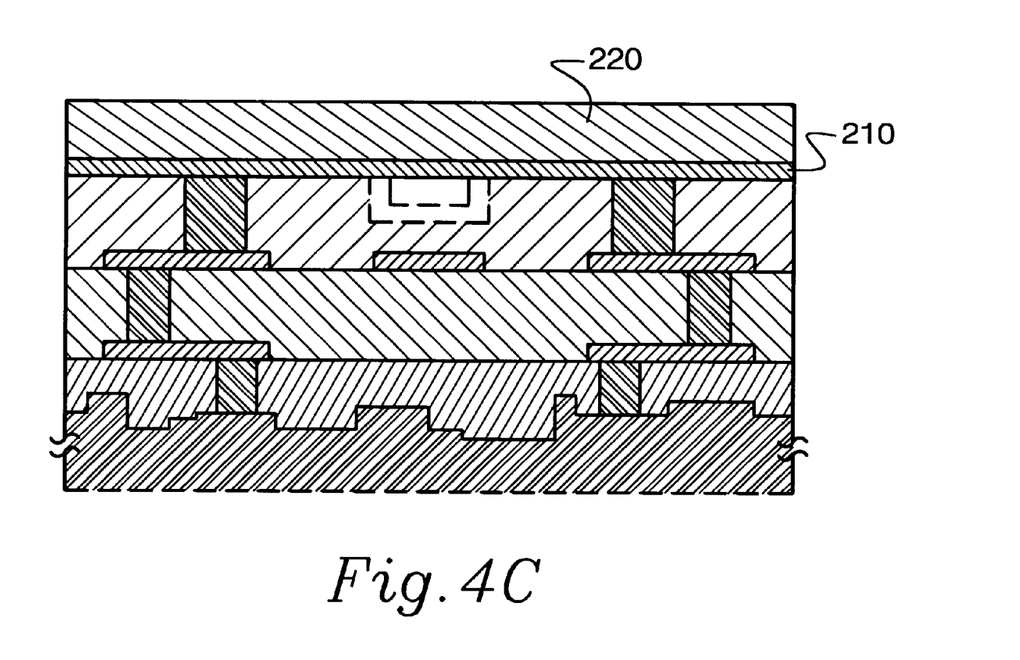

All of the depositions of magnetic stack 220 are preferably done in-situ, for example in a Comptech ISL-3000 sputter deposition system. The deposition of the Permalloy layers are done in the presence of a 25 Oersted magnetic field. The wafer is then subjected to a 350 degree C, 1 hour, 1000 Oersted anneal to set the easy axis of Permalloy layers.

While a NiFeCo magnetic material is preferred, it is contemplated that any type of magnetic material may be used including Anisotropic Magneto-resistive (AMR) materials, Giant Magneto-Resistive (GMR) materials and/or Colossal Magneto-Resistive (CMR) materials.

Figure 4D:
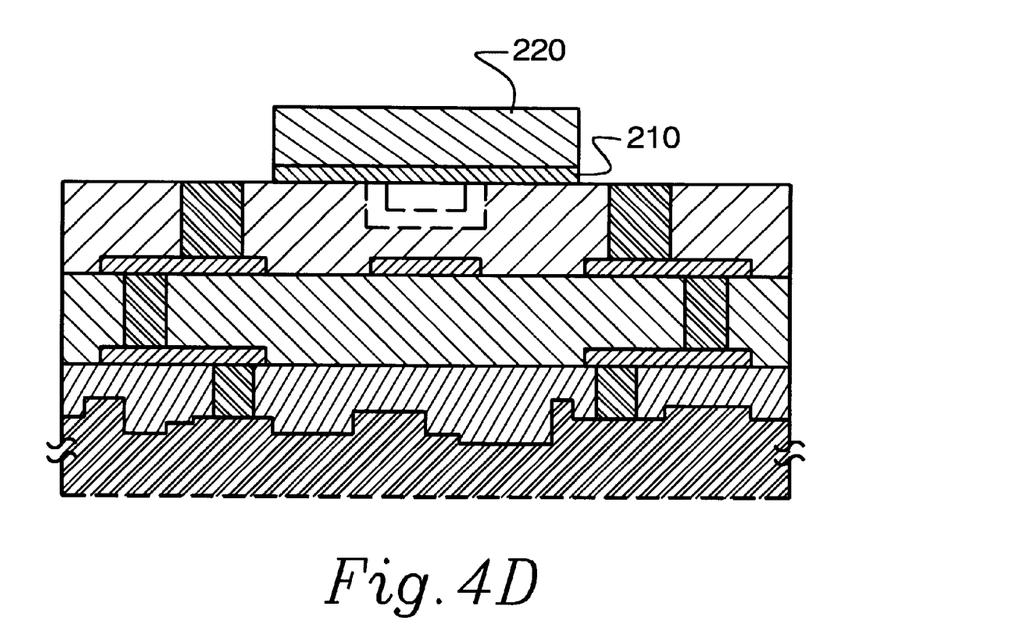
Figure 4E:
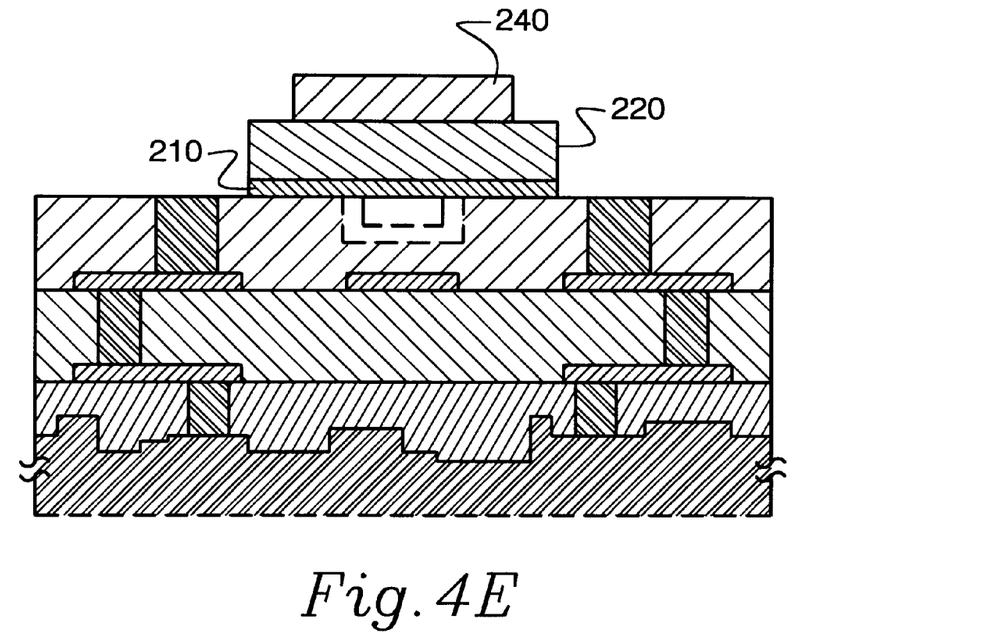

Still referring to FIGS. 3B, a layer of an amorphous dielectric, e.g., PECVD TEOS, is deposited to a thickness of approximately 3200 angstroms. TEOS layer is then patterned and etched to serve as a masking layer, as shown by process step 224. This masking layer defines the MRAM bit pattern for the ion milling. The wafers are then ion milled as shown at process step 226, for example in a Commonwealth ion mill. The ion milling removes the exposed portions of magnetic stack 220 and silicon nitride layer 210 to form a bit pattern. The result is shown in FIG. 4D.

Next, a low temperature dielectric layer is deposited, patterned and etched as shown by steps 230, 232 and 234, respectively. This results in a bit oxide layer 240 (see FIG. 4E) that covers at least a portion of the top surface of the magnetic stack 220.

A third metal interconnect layer 192 is then deposited, patterned and etched as shown by steps 250, 252 and 254, respectively. The third metal interconnect layer is electrically connected to at least a portion of the magnetic stack 220, as shown in FIG. 4F.

Finally, process steps 260, 262 and 264 provide a plasma nitride passivation layer. Following passivation, a back metal is deposited at step 270. Finally, step 280 anneals the wafers at 250 to 500 degrees C, preferably 310° C. for one hour in a magnetic field to permanently set the easy axis orientation transverse to the bits. A 4000 Oersted magnetic field has been used successfully. Other magnetic field values may also be used.

As is evident from the foregoing description, the present invention contemplates depositing the magnetic materials after the contact and via structures are formed. This may allow plug processing to be used on magnetic RAM devices, thereby increasing the packing density of the same.

Figure 4F:
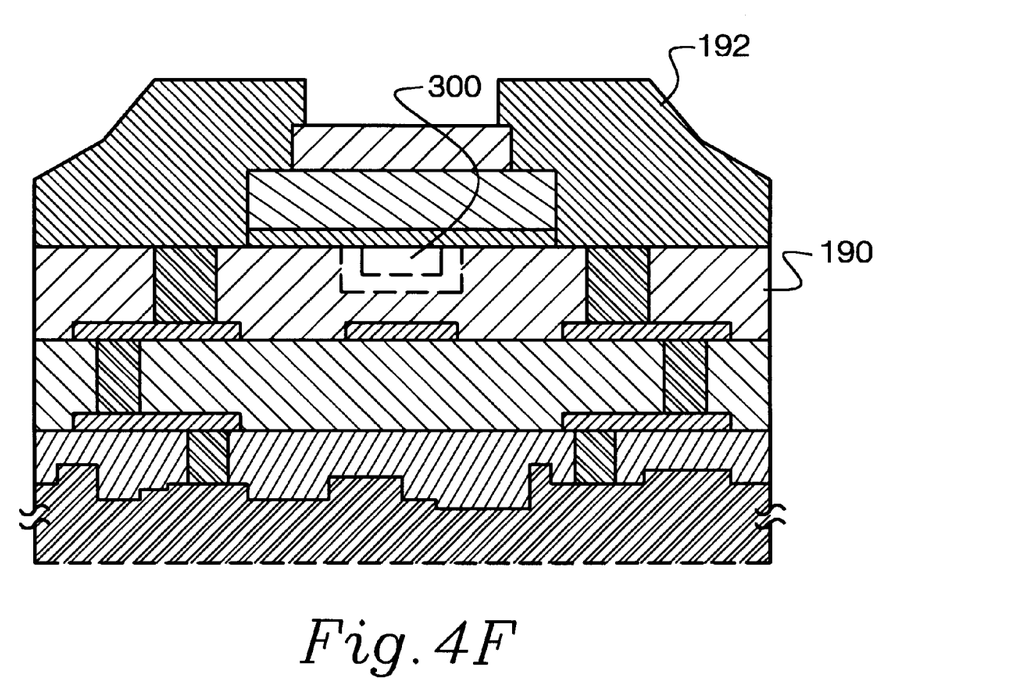

Finally, and specifically referring to FIG. 4F, it is contemplated that a word line structure 300 having a magnetic field keeper may be formed directly under the magnetic stack. The word line structure is shown in phantom lines, and may be formed by: providing a cavity in the third dielectric layer 190; partially filling the cavity with a soft magnetic material; and filling the remainder of the cavity with a word line metal material. A detailed discussion of this feature can be found in commonly assigned U.S. patent application Ser. No 08/993,009, filed Dec. 18, 1997, and entitled "SELF-ALIGNED WORDLINE KEEPER AND METHOD OF MANUFACTURE THEREFOR".

Having thus described the preferred embodiments of the present invention, those of skill in the art will readily appreciate that the teachings found herein may be applied to yet other embodiments within the scope of the claims hereto attached.

What is claimed is:

1. A method for fabricating a magnetoresistive memory device having a magnetic bit region, the magnetoresistive memory device fabricated by performing a number of processing steps, the method comprising the steps of:
   performing all via processing for the magnetoresistive memory device before providing the magnetic bit region of the magnetoresistive memory device.

2. A method according to claim 1 wherein the selected via processing steps include a via plug processing step.

3. A method according to claim 2 wherein the via plug processing step includes depositing a tungsten plug into a via opening.

4. A method according to claim 3 wherein at least part of the via plug processing step is performed above 250° C.

5. A method for fabricating a magnetoresistive memory device having a magnetic bit region, the magnetoresistive memory device fabricated on an integrated circuit having a number of underlayers, the method comprising the steps of:

providing an insulating layer above the underlayers;

performing selected contact processing steps for forming one or more contact holes that extend through the insulating layer to selected portions of the underlayers filling the contact holes with an electrically conductive material, thereby forming filled contact holes having a top surface;

planarizing the insulating layer along with the top surface of the contact holes;

providing a magnetic bit region above the insulating layer;

providing an interconnect layer, wherein the interconnect layer overlaps and forms an electrical connection with at least part of the bit region and further overlaps and forms an electrical connection with at least one of the filled contact holes.

6. A method for fabricating a magnetoresistive memory device on a first insulating layer, comprising the steps of:

providing a first interconnect layer above the insulating layer;

providing a second insulating layer above the first interconnect layer;

forming via holes through the second insulating layer down to the first interconnect layer;

filling the via holes with an electrically conductive material, thereby forming filled via holes having a top surface;

planarizing the second insulating layer along with the top surface of the via holes;

providing a magnetic bit region above the second insulating layer;

providing a second interconnect layer, wherein the second interconnect layer overlaps and forms an electrical connection with at least part of the bit region and further overlaps and forms an electrical connection with at least one of the filled via holes.

7. A method according to claim 6 wherein the second insulating region is planarized using a polishing step.

8. A method according to claim 7 wherein the polishing step is a mechanical polishing step.

9. A method according to claim 7 wherein the polishing step is a chemical-mechanical polishing step.

10. A method according to claim 6 further comprising the step of providing one or more openings in the first insulating layer before providing the first interconnect layer.

11. A method according to claim 10 wherein the one or more openings are at least partially filled with tungsten.

12. A method according to claim 6 wherein said second insulating layer comprises an insulating layer and a barrier layer.

13. A method according to claim 12 wherein selected portions of the barrier layer are removed after the bit region is provided.

14. A method according to claim 12 wherein said bit region is formed on the top surface of the barrier layer of said second insulating layer.

15. A method for fabricating a magnetoresistive memory device comprising the steps of:

providing a first insulating layer above the top surface of an integrated circuit having a number of layers;

providing a number of openings in the first insulating layer;

providing a first interconnect layer above the first insulating layer, wherein selected portions of the interconnect layer overlay at least one of the openings;

providing a second insulating layer above the first interconnect layer;

providing all via openings in the second insulating layer for the magnetoresistive memory device before providing a bit region above the second insulating layer; and providing a second interconnect layer above the second insulating layer, wherein selected portions of the second interconnect layer overlay at least one of the via openings, and wherein selected portions of the second interconnect layer are electrically connected to the bit region.

16. A method according to claim 15 wherein the number of openings are at least partially filled with tungsten.

17. A method according to claim 15 wherein the number of via openings are at least partially filled with tungsten.

18. A method according to claim 15 further comprising the step of planarizing at least the second insulating layer before providing the bit region.

19. A method according to claim 18 wherein the second insulating layer includes a dielectric layer and a barrier layer.

20. A method according to claim 18 wherein the second insulating layer is planarized via a polishing step.

21. A method according to claim 20 wherein the polishing step is a mechanical polishing step.

22. A method according to claim 20 wherein the polishing step is a chemical-mechanical polishing step.

23. A method according to claim 15 further comprising the step of providing a bit oxide layer above at least a portion of the top of the bit region before the second interconnect layer is formed.

24. A method according to claim 15 wherein the at least one magnetic material is a Anisotropic Magneto-Resistive (AMR) Material.

25. A method according to claim 15 wherein the at least one magnetic material is a Giant Magneto-Resistive (GMR) Material.

26. A method according to claim 15 wherein the at least one magnetic material is a Callosal Magneto-Resistive (CMR) Material.

* * * * *